United States Patent [19]

Tamaki et al.

[11] Patent Number: 4,926,235

[45] Date of Patent: May 15, 1990

[54] SEMICONDUCTOR DEVICE

[76] Inventors: Yoichi Tamaki, 3-4-2-606, Izumicho;
Tokuo Kure, 1-217,
Higashikoigakubo, both of
Kokubunji-shi, Tokyo; Tohru
Nakamura, 6-6-16-614, Minamicho,
Tanashi-shi, Tokyo; Tetsuya
Hayashida, 2196-5, Hirai,
Hindodemachi, Nishitama-gun,
Tokyo; Kiyoji Ikeda, 1-48-18,
Akatsukicho, Hachioji-shi, Tokyo;
Katsuyoshi Washio, 1-26-39, Wada,
Higashi-tokorozawa,
Tokorozawa-shi, Saitama; Takahiro
Onai, 2-32, Koyasumachi,
Hachioji-shi, Tokyo; Akihisa Uchida,
Wakaba-kopo 207, 1-3-17,
Wakaba-cho, Tachikawa-shi, Tokyo;
Kunihiko Watanabe,
Hitachi-fujimi-so A202, 2-1-16,
Midorigaoka, Hamuracho,
Nishitama-gun, Tokyo, all of Japan

[21] Appl. No.: 106,861

[22] Filed: Oct. 13, 1987

[30] Foreign Application Priority Data

Oct. 13, 1986 [JP] Japan .................. 61-241291

Feb. 5, 1987 [JP] Japan .................. 62-23605

[51] Int. Cl.$^5$ .................................................. H01L 23/48
[52] U.S. Cl. .................................... 357/68; 357/34;
357/49; 357/55; 357/71
[58] Field of Search .................... 357/49, 55, 68, 34,
357/71

[56] References Cited

U.S. PATENT DOCUMENTS 4,688,069  8/1987  Joy et al. .................... 357/49
4,812,894  3/1989  Nakamura et al. .................... 357/49

Primary Examiner—Edward J. Wojgiechowicz
Attorney, Agent, or Firm—Antonelli, Terry, Stout & Kraus

[57] ABSTRACT

A semiconductor device is disclosed, which includes bipolar transistor each having an emitter, base and collector formed inside each protruding portion of a semiconductor substrate, and trenches for device isolation. The bipolar transistor and the trench are spaced apart from each other by a predetermined spacing. According to this arrangement, the width of a base contact becomes uniform and any change of transistor characteristics can be prevented effectively.

30 Claims, 7 Drawing Sheets

SEMICONDUCTOR DEVICE

BACKGROUND OF THE INVENTION

This invention relates generally to a semiconductor device, and more particularly to a bipolar transistor having higher performance and capable of high density integration.

Higher performance and higher integration density have been required for semiconductor devices having bipolar transistors of the recent types (semiconductor bipolar integrated circuits). A structure shown in FIG. 1 of the accompanying drawings has been proposed in order to improve performance of a bipolar transistor (refer to Japanese Patent Laid-Open No. 1556/1981).

In FIG. 1, reference numeral 1 represents a P-type Si (silicon) substrate, 2 is a high concentration N-type collector buried layer, 12 is a channel stopper layer, 19 is a SiO$_2$ (silicon dioxide) film for device isolation, 20 is a high concentration N-type impurity doped layer for taking out a collector electrode, 21 is a high concentration P-type base region, 24 is a high concentration N-type emitter region, 18 is a polycrystalline Si film for taking out a base electrode, 22 is a passivation film made of Si$_3$N$_4$ (silicon nitride) or PSG (phosphosilicate glass), 25 a base electrode, 26 is an emitter electrode and 27 is a collector electrode.

The conventional semiconductor device having the structure shown in FIG. 1 is characterized in that the emitter 24, base 21 and collector 2' below the base 21 of the bipolar transistor are formed inside a protruding portion of the silicon substrate, and the base extension electrode consisting of the polycrystalline silicon film 18 into which large quantities of impurity is doped and which has low resistance is connected to the side portion of the base 21. Hereinafter, this structure will be referred to as "SICOS (Sidewall Base Contact Structure)".

Such an SICOS semiconductor device is extremely effective for reducing the size of the bipolar transistor itself and for improving the performance of the transistor, but since the area of isolation regions between the devices is great, the semiconductor device is not suitable for high density integration.

A structure shown in FIG. 2 has been proposed in order to solve the problem described above (refer to Japanese Patent Laid-Open No. 235460/1985).

In FIG. 2, like reference numerals are used to identify like constituents as in FIG. 1 (and this will also hold true of all the later-appearing drawings).

In FIG. 2, reference numeral 30 represents a shallow trench for isolating the emitter and the collector, 31 is a deep trench for device isolation which has a substantially U-shaped cross-section, and 14 is poly-Si packed into the deep trench 31.

The conventional semiconductor device shown in FIG. 2 is characterized in that the deep trench 31 for device isolation, which has a substantially U-shaped section, is formed in the proximity of the base region 21 and the collector region 20, with the rest of the structure being the same as that of the semiconductor device shown in FIG. 1. In other words, the semiconductor device shown in FIG. 2 isolates the devices by the deep trench to drastically reduce the area of the device isolation region and accomplishes the high integration density of the high performance bipolar integrated circuit.

In the conventional semiconductor device shown in FIG. 2, however, it is difficult to form the contact width between the poly-Si film 18 for taking out the base electrode and the base region 21 in the same size on the side of the deep trench 31 for device isolation as on the side of the shallow trench 30. In other words, this structure involves the problem that the contact width a on the side of the deep trench 31 is different from the contact width b on the side of the shallow trench 30, that is, on the right side and on the left side in FIG. 2. Namely, the contact width a on the side of the deep trench 31 becomes small while the contact width b on the side of the shallow trench 30 becomes great.

If the contact width exhibits variation (or if the shape of the impurity doped layer of the base region 21) changes, the characteristics of the transistor such as a breakdown voltage, parasitic capacitance, a current amplification ratio, a rise voltage ($V_{BE}$), and the like, vary so that the operation of the integrated circuit gets unstable. If the contact width a on the side of the deep trench 31 becomes small, the base resistance becomes high and the operation speed of the transistor drops.

SUMMARY OF THE INVENTION

In order to solve the problems of the prior art technique described above, the present invention contemplates to provide a high performance high integration density semiconductor bipolar integrated circuit which prevents the decrease of the contact width between a semiconductor layer in which a base region is formed and a conductive layer for taking out a base electrode, and controls the contact width on both deep and shallow trench sides to the same size so that any variations of transistor characteristics can be reduced and the circuit operation can be stabilized.

To accomplish the object described above, the present invention forms the deep trench for device isolation in the spaced-apart relationship by a predetermined distance from a region (active region) in which the device is formed. In other words, in accordance with the present invention, the deep trench for device isolation is formed in the proximity of the active region of a bipolar transistor having a structure wherein a base extension electrode is connected to the side portion of the base region, and the active region in which the base, emitter, and the like are formed and the deep trench are formed in the spaced-apart relationship by a predetermined distance from each other.

Particularly, the distance d between the position of the deep trench and the active region is preferably from 0.1 to 1.0 μ.

The reason why the contact width between the side portion of the base region and the conductive layer for taking out the base varies on the deep trench side and on the shallow trench side may be as follows. When insulation films are formed inside the deep and shallow trenches by selective oxidation, the deep trench and the shallow trench have different shapes as shown in FIG. 2 so that the length of penetration of the oxide film (so-called "bird-beak") in the transverse direction, that occurs at the time of oxidation of the surfaces of the trenches, varies so that the contact width on the deep trench side is not the same as that on the shallow trench side but is different from each other.

If the position of the deep trench is spaced apart by a predetermined distance from the active region, the shape of the deep trench at the contact portion on the deep trench side can be made the same as the shape of the shallow trench (the portions represented by reference numerals 32 and 33 in FIG. 3 showing one embodiment of the present invention). According to this arrangement, the condition for oxidation of the silicon substrate at the time of oxidation of the trench surface can be made equal on both the deep and shallow trench sides, the length of the bird-beak can be made the same on both the deep and shallow trench sides, the contact width on both the deep and shallow trench sides can be made the same and variations of the transistor characteristics can be reduced.

DESCRIPTION OF THE PREFERRED EMBODIMENTS

[Embodiment 1]

Figure 3:
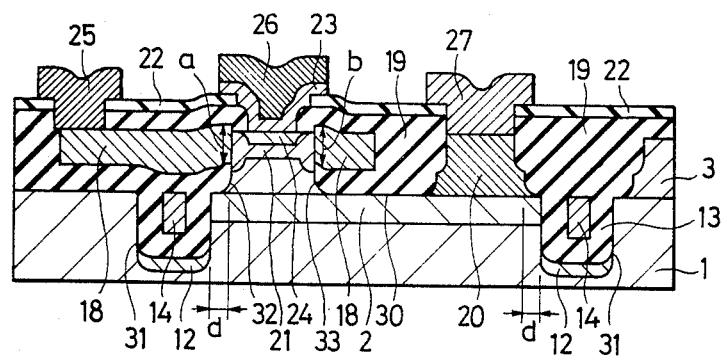
FIG. 3 is a sectional view showing one embodiment of the present invention.

FIG. 3 is a sectional view of the bipolar transistor in accordance with one embodiment of the present invention.

As shown in the drawing, the deep trench 31 for device isolation having a substantially U-shaped section is formed in the Si substrate 1 in the proximity of the active region (the single crystal Si layer), where the emitter region 24, the base region 21 and the collector region 20 are formed, in the spaced-apart relation in a distance d (about 0.1 to 1.0 $\mu$) from the side surface of the base region 21 in the transverse direction.

Figure 1:
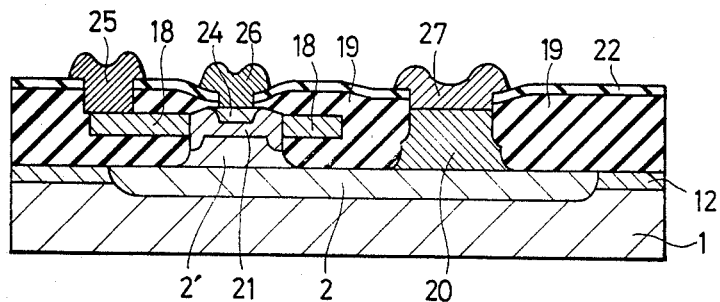
FIGS. 1 and 2 are sectional views showing the structures of conventional semiconductor devices, respectively.
Figure 2:
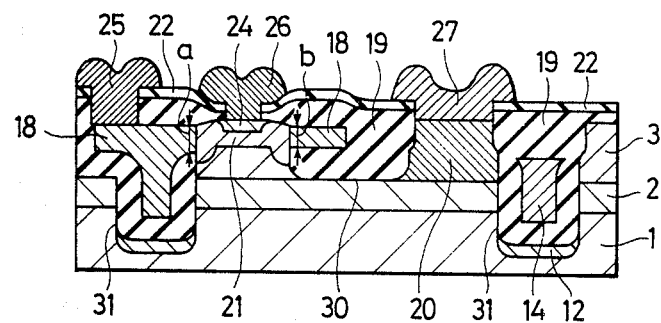

As is obvious from FIG. 2, the deep trench 31 is formed while keeping contact with the left side surface of the base 21 in the conventional structure and they are not spaced apart from each other.

Since the deep trench 31 is formed in the spaced-part relationship by the predetermined distance d from the side surface of the base region 21 in this embodiment, the shape 32 of the deep trench 31 on the side of the active region is in agreement with the shape 33 of the shallow trench 30 on the side of the active region. Therefore, the condition for surface oxidation of the deep trench 31 and the shallow trench 30 becomes the same and the length of the bird-beak in the transverse direction becomes the same. For these reasons, the contact width a on the side of the deep trench 31 and the contact width b on the side of the shallow trench 30 are the same and any variation of the transistor characteristics can be reduced drastically.

In this embodiment, device isolation is made by the deep trench 31 so that the area of the device isolation region can be reduced drastically and high integration density of the high performance bipolar integrated circuit can be accomplished. Furthermore, variation of the transistor characteristics can be restricted and the operation of the bipolar integrated circuit can be stabilized by making the same the contact width between the base region 21 formed in the protruding portion of the single crystal Si substrate and the poly-Si film 18 connected to the base region 21. In the conventional structure, since the bird-beak penetrates deeply on the side of the deep trench 31 and the contact width on the side of the shallow trench 31 decreases so that the base resistance drops. In accordance with this embodiment, however, the drop of the base resistance as well as the degradation of the transistor characteristics can be prevented.

Next, the fabrication method of the bipolar transistor shown in FIG. 3 will be explained with reference to FIGS. 4a to 4f. FIGS. 4a to 4f are sectional views showing stepwise the fabrication method of the bipolar transistor shown in FIG. 3.

Figure 4A:
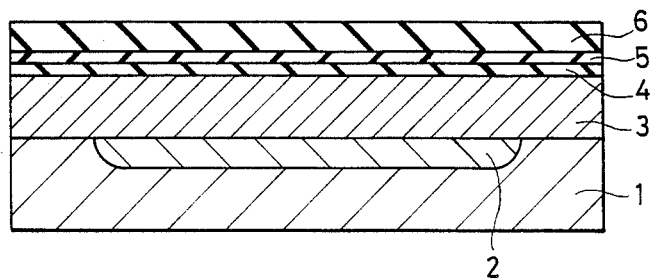
FIGS. 4a to 4f are sectional views useful for explaining step-wise the fabrication method of the semiconductor device shown in FIG. 3.

First of all, an impurity is doped into the P-type Si substrate 1 to form the high concentration N-type collector buried layer 2 and the N-type Si epitaxial layer 3 is formed on the collector buried layer 2 by a known epitaxial growing method as shown in FIG. 4a. Furthermore, the SiO$_2$ film 4 and the Si$_3$N$_4$ film 5 are formed on the Si epitaxial layer 3 and the SiO$_2$ film 6 is formed further thereon by known CVD (Chemical Vapor Deposition).

Figure 4B:
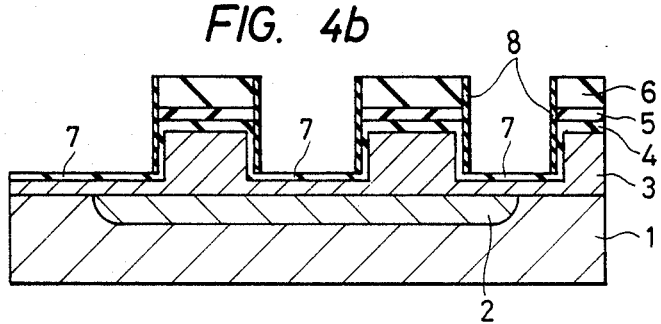

Next, the three-layered film of the SiO$_2$ film 4, the Si$_3$N$_4$ film 5 and the SiO$_2$ film 6 is patterned by known photoetching technique as shown in FIG. 4b and the epitaxial Si layer 3 is etched to form a trench by use of the patterned three-layered film as the mask. Then, the surface of this trench is oxidized to from a thin SiO$_2$ film 7. Next, after an Si$_3$N$_4$ film is deposited to the entire surface, directive dry etching is effected to leave the Si$_3$N$_4$ film 8 on only the side wall of the protruding portion.

Figure 4C:
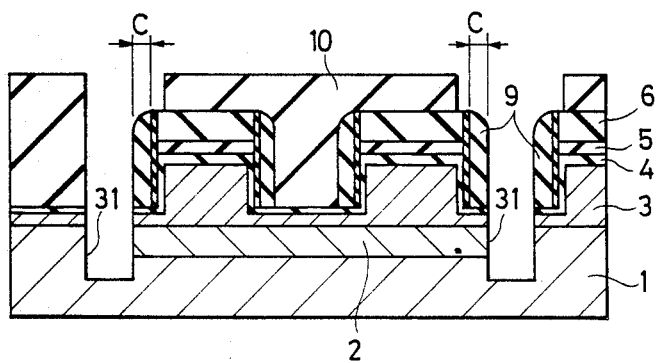

After the SiO$_2$ film is deposited to the entire surface by known CVD, directive dry etching is effected to leave the SiO$_2$ film 9 on only the sidewall of the protruding portion. After a photoresist film is deposited to the entire surface, it is removed by development at portions other then the portion covered with the photoresist film, where the deep trench is to be formed, as shown in FIG. 4c, thereby forming the photoresist film 10. Thereafter, the thin SiO$_2$ film 7, the epitaxial Si layer 3 and the Si substrate 1 are dry-etched using the photoresist film 10, the SiO$_2$ film 9 and the SiO$_2$ film 6 as the mask and the exposed portions are sequentially removed to form the deep trench 31 for device isolation. The distance between the active region of the transistor and the deep trench 31 for device isolation is determined by the thickness c of the SiO$_2$ film 9 formed on the sidewall.

Figure 4D:
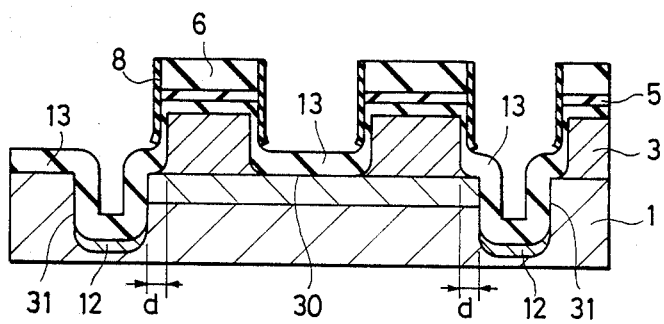

Next, ion implantation for preventing the formation of a channel is made to form the channel stopper layer 12 as shown in FIG. 4d. After the photoresist film 10 described above is removed, the inside of the deep trench 31 is oxidized selectively and thermally using the Si$_3$N$_4$ films 5 and 8 as the mask, thereby forming the SiO$_2$ film 13 for device isolation.

Since the Si epitaxial layer (single crystal Si) 3 as the active region and the deep trench 31 are spaced apart from each other by the distance d at this time as shown in FIG. 4d, no difference of the penetration of the bird-beak below the Si$_3$N$_4$ film 8 can be observed between the side of the deep trench 31 and the shallow trench 30. However, if the distance d is less than 0.1 $\mu$, the distance of the bird-beak on the side of the deep trench 31 becomes greater than on the side of the shallow trench 30, the distance is preferably set to be greater than 0.1 $\mu$. If d is above 1.0 μ, on the other hand, not only the integration density drops but also the parasitic capacitance between the wirings and the substrate increases. Accordingly, the distance d is preferably below 1.0 μ.

Figure 4E:
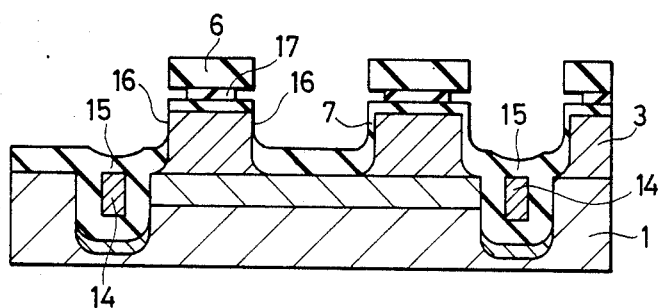

Next, as shown in FIG. 4e, poly-Si is buried into the deep trench 31 by CVD and the surface is then oxidized to form the SiO$_2$ film 15. After the Si$_3$N$_4$ film 8 described above is removed, the SiO$_2$ film 7 that has been formed on the side surface of the Si epitaxial layer 3 of the region, where the emitter is to be formed, is removed by photo-etching and the Si$_3$N$_4$ film 5 is side-etched to form the recess 17.

Figure 4F:
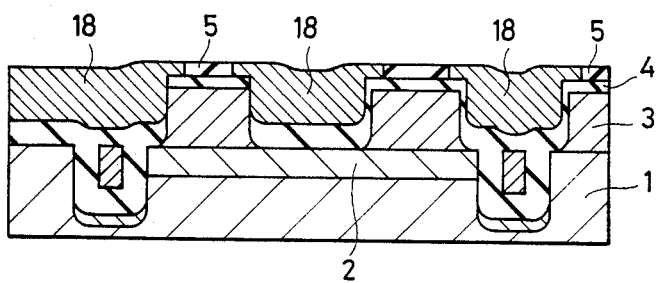

After the poly-Si film 18 is deposited to the entire surface as shown in FIG. 4f, the surface is flattened and boron (B) ion as an N-type impurity is implanted into the poly-Si film 18. The SiO$_2$ film 6 remaining on the surface is then removed.

Next, the poly-Si film 18 at portions other than the portion which serves as the base electrode extension conductor layer is selectively oxidized and changed to SiO$_2$ film 19 as shown in FIG. 3 and known impurity doping is further effected to form the high concentration N-type impurity doped layer 20 for taking out the collector electrode and the high concentration P-type base region 21. Next, the passivation film 22 is formed by use of Si$_3$N$_4$ or PSG and holes are formed on this passivation film 22 and on the SiO$_2$ film 19 for extending the emitter electrode. After the poly-Si film 23 containing large amounts of an N-type impurity is formed on the holes, the high concentration N-type emitter region 24 is formed by heating the poly-Si film 23 so as to diffuse the N-type impurity. The contact holes for the base and collector electrodes are opened, and the base electrode 25, the emitter electrode 26 and the collector electrode 27 are then formed by use of aluminum. There is thus completed a transistor shown in FIG. 3.

In order to separate the active region from the deep trench 31 for device isolation by the predetermined distance d in the fabrication process described above, the CVD SiO$_2$ film 9 is left in the thickness c on the sidewall of the protruding portion as shown in FIG. 4c and the deep trench 31 is formed by self-alignment by use of this SiO$_2$ film 9. In contrast, it is also possible to form the deep trench 31 by use of only the photoresist film 10 as the mask and then to dry-etch the Si substrate 1, the Si epitaxial layer 3 and the thin SiO$_2$ film 7 in order to simplify the fabrication process. Here, the mask pattern of the photoresist film 10 is shaped in such a manner that the deep trench 31 is formed at the position spaced apart by the predetermined distance e from the active region. In this case, the distance e is made greater by the masking margin.

[Embodiment 2]

As described above, the width of the contact between the conductive film (poly-Si film) for taking out the electrode and the active region varies with the difference of the length of the bird-beak that occurs from position to position due to selective oxidation of the surfaces of the deep and shallow trenches by use of the Si$_3$N$_4$ film formed on the sidewall of the active region as the mask.

Therefore, the adverse influence of the bird-beak on the contact width can be reduced by bringing the contact position described above to the upper part of the active region.

Figure 6:
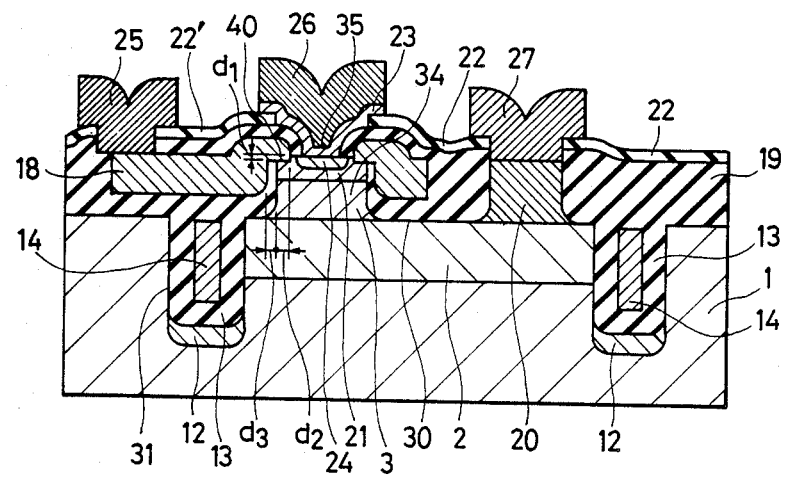
FIG. 6 is a sectional view showing another embodiment of the present invention.

FIG. 6 is a sectional view showing a bipolar NPN transistor in accordance with another embodiment of the present invention.

In FIG. 6, reference numeral 1 represents a P-type Si (silicon) substrate, 2 is a high concentration N-type collector buried layer, 12 is a P-type channel stopper layer, 19 is a SiO$_2$ (silicon dioxide) film for device isolation, 31 is a deep trench for device isolation, 30 is a shallow trench for device isolation, 15 is a SiO$_2$ film formed inside the deep trench, 14 is a poly-Si film for packing, 20 is a high concentration N-type doped region for taking out the collector electrode, 21 is a P-type base region, 24 is a high concentration N-type emitter region, 18 is a poly-Si film for taking out the base, 22 is a passivation film consisting of a Si$_3$N$_4$ (silicon nitride) film or PSG (phosphosilicate glass), 23 is a poly-Si film, 25 is a base electrode, 26 is an emitter electrode and 27 is a collector electrode.

In this embodiment, the poly-Si film 18 for taking out the base electrode is brought into contact with the base region 22 at a step portion 40 at the upper end portion of the single crystal semiconductor layer. According to this arrangement, the width of this contact can be made equal on the side of the deep trench 13 for device isolation (left side in FIG. 6) and on the side of the shallow trench 30 for device isolation (right side in FIG. 6) so that variations of the transistor characteristics such as the current amplification ratio and the rise voltage ($V_{BE}$) can be reduced to the half or below in comparison with the conventional transistors and the transistor characteristics can be thus stabilized.

This effect can be observed practically sufficiently even though the active region and the deep trench are formed in contact with each other, and by far higher characteristics can be obtained than the conventional semiconductor devices. However, if the active region and the deep trench are formed in the spaced-apart relationship from each other as shown in FIG. 6, the effect becomes further remarkable and still higher characteristics can be obtained.

Since the poly-Si film 18 is brought into contact with the base region 21 at the step portion 40 at the upper end portion of the single Si layer 3, the depth of the graft base region can be made small. Since the depth $d_1$ of the step portion 40 is from about 0.02 to about 0.2 μ, it approaches to the intrinsic base region. Accordingly, the base-collector parasitic capacitance can be reduced by about 30% in comparison with the prior art devices and the base resistance drops by about 10%. However, if the depth $d_1$ is above 0.2 μ, the width of the base region 21 below the poly-Si film 18 becomes small so that the base-collector capacitance becomes great and the breakdown voltage drops.

Since the width $d_2$ of the contact is as small as from about 0.05 to about 0.3 μ, the area of the emitter region 24 can be made greater than that of the collector region 34. Accordingly, the current amplification ratio can be improved. If the width $d_2$ is below 0.05 μ, however, the contact resistance between them increases so that the base resistance is likely to increase. For this reason, the width $d_2$ is preferably above 0.05 μ.

Furthermore, the thickness $d_3$ of the insulation film 24 isolating the single crystal Si layer 34 from the poly-Si film 18 must be from about 0.03 to about 0.4 μ in order to prevent the occurrence of pin-holes and to isolate them. If the thickness is below 0.03 μ, the breakdown voltage drops and if it is above 0.4 μ, the base resistance increases.

The conductor film for taking out the electrode and the single crystal conductor layer are brought into mutual contact at the step portion disposed at the upper end portion of the single crystal semiconductor layer in this embodiment. Therefore, when the present invention is applied to a vertical bipolar transistor, for example, the depth of the graft base region, which is formed by diffusing the impurity from this conductive film, can be reduced. Since the conductive film for ranking out the base electrode comes into contact with the base region at the step portion which is a little bit below the surface of the emitter region, the conductive film can be approached to the intrinsic base region by increasing the depth of the step portion, so that the base-collector parasitic capacitance can be reduced and the base resistance can be lowered. (The depth of the step portion is preferably from about 0.02 to about 0.2 $\mu$.) However, if the depth is too much great (e.g. above 0.2 $\mu$), the width of the base region below the conductor film becomes small so that the base-collector capacitance increases and the breakdown voltage drops undesirably.

The area of the emitter region can be made greater than that of the collector region by reducing the width of the contact portion between the conductor film and the base region in the direction of the substrate surface (preferably to about 0.05 to about 0.3 $\mu$), so that the current amplification ratio can be improved. However, if the width is too small (e.g. below 0.05 $\mu$), the contact resistance between them increases so that the base resistance increases undesirably.

Furthermore, the thickness of the insulation film interposed between the conductive film and the single crystal semiconductor layer must be such that they can be isolated from each other (preferably from about 0.03 to 0.4 $\mu$). If it is too small (e.g. below 0.03 $\mu$), pin-holes develop and the breakdown voltage drops. If it is too great (e.g. above 0.4 $\mu$), on the other hand, the base resistance increases.

Next, the fabrication method of the semiconductor device shown in FIG. 6 will be explained.

Figure 7A:
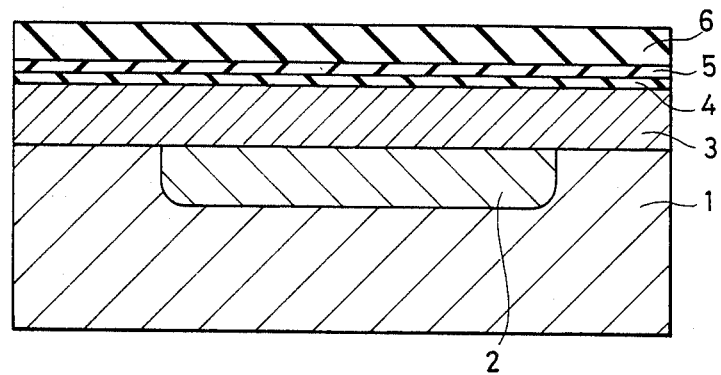
FIGS. 7a to 7e are sectional views useful for explaining step-wise the fabrication method of the semiconductor device having the structure shown in FIG. 6.

First of all, the N-type buried layer 2 for the collector is formed selectively on the P-type Si substrate 1 and the Si epitaxial growth layer 3 is formed on the N-type buried layer 2 as shown in FIG. 7a. Furthermore, the SiO$_2$ film 4 is formed by thermal oxidation and the Si$_3$N$_4$ film 5 and the SiO$_2$ film 6 are formed sequentially on the entire surface by known CVD technique.

Figure 7B:
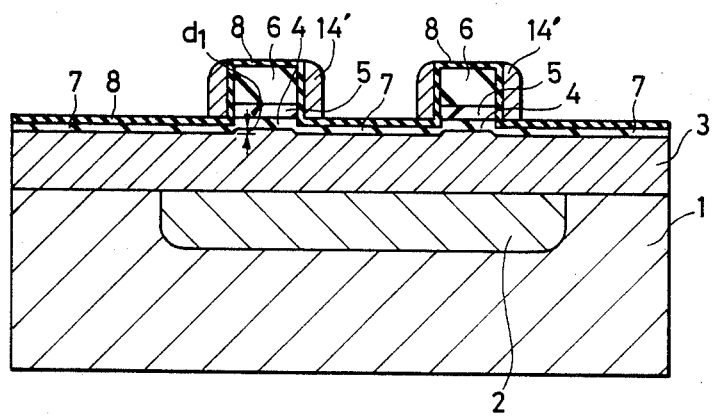

The three-layered film 4, 5, 6 is patterned as shown in FIG. 7b by photolithography and dry etching and after the photoresist film used for patterning is removed, the surface of the Si substrate 1 is thinly oxidized to form the SiO$_2$ film 7. Next, the Si$_3$N$_4$ film 8 is deposited to the entire surface by CVD and after the poly-Si film is deposited, directive dry etching is effected to leave the poly-Si film 14' on only the side wall of the protruding three-layered film 4, 5, 6, that is patterned, through the SiN$_4$ film 8.

Figure 7C:
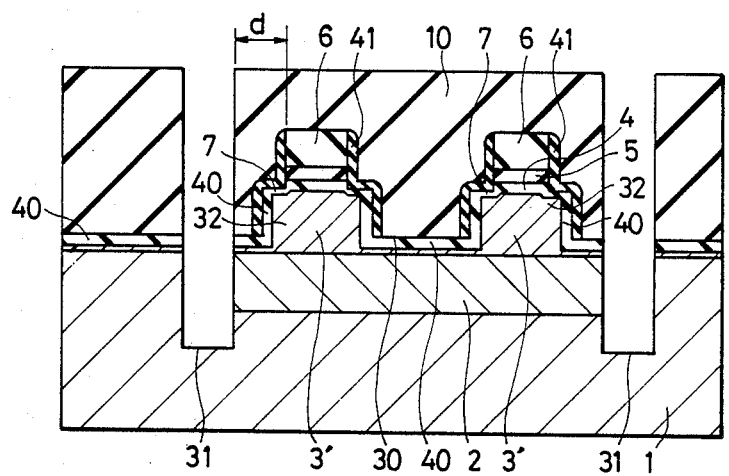

Next, the Si$_3$N$_4$ film 8 and the SiO$_2$ film 7 are removed by etching by use of the poly-Si film 14' described above as the mask as shown in FIG. 7c, and Si etching is then made to form the shallow trench 30 in the epitaxial growth layer 30. (At this time, the poly-Si film 14' formed on the sidewall is etched and removed, too.) Its surface is oxidized to form the SiO$_2$ film 40. Next, after the Si$_3$N$_4$ film is deposited to the entire surface, directive dry etching is made to leave the Si$_3$N$_4$ film 41 as shown in FIG. 7C.

Next, a photoresist film 10 having a pattern for forming the deep trench for device isolation is coated on the substrate, and the SiO$_2$ film 40 and Si (epitaxial layer and substrate) are etched using this photoresist film 10 as the mask, thereby forming the deep trench 31 penetrating through the N-type buried layer 2. Here, a step 32 which is determined by the thickness of the poly-Si film 14' is formed in the island 3' of Si. Furthermore, the Si island 3' and the deep trench 31 are spaced apart in advance from each other by the distance d by the mask lest they come into mutual contact.

Figure 5:
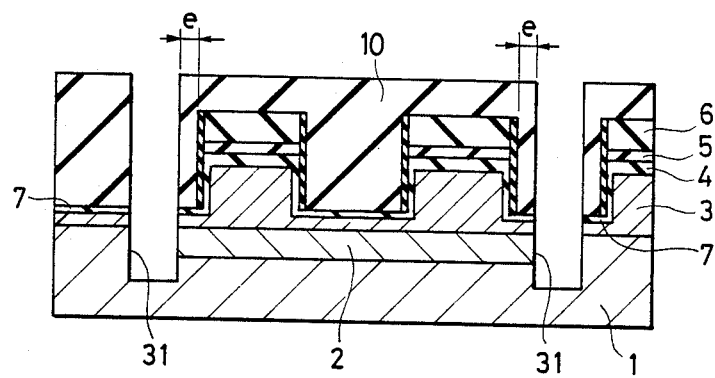
FIG. 5 is a sectional view showing another fabrication process of the present invention.

Next, after the photoresist film 10 is removed by etching, boron (B) ion is implanted to form the P-type channel stopper layer 12 for preventing the formation of a channel on the bottom of the deep trench 31 as shown in FIG. 5. Si is oxidized selectively using the Si$_3$N$_4$ films 5 and 11 as the mask so as to form an about 0.2 to about 1.0 $\mu$-thick SiO$_2$ film 13 and after the poly-Si film is deposited, etching-back is made so as to bury the deep trench 31 by the poly-Si film 14.

Figure 7D:
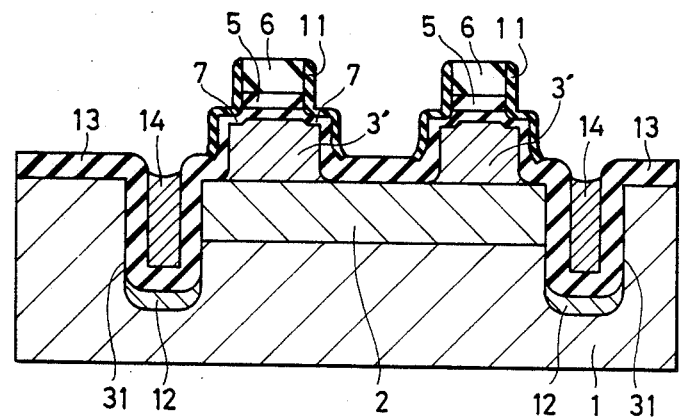
Figure 7E:
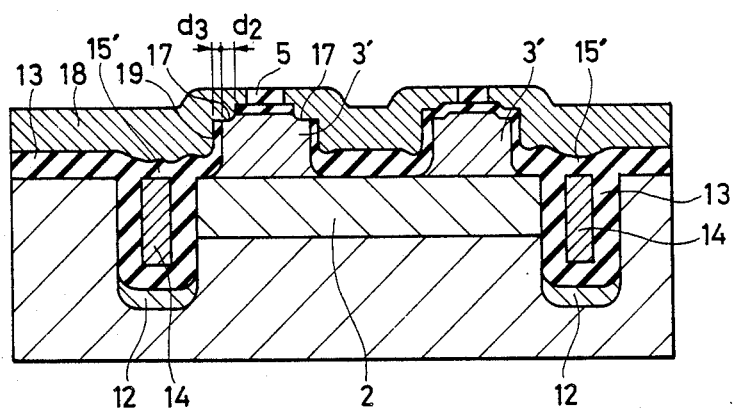

Oxidation is made once again and the SiO$_2$ film 15' is formed on the surface of the poly-Si film 14 as shown in FIG. 7e and the Si film 11 (FIG. 7d) is removed by etching. The Si island 3' is light-etched by known dry etching (or wet etching) technique to etch and remove the SiO$_2$ film 7 and to form the hole 17 for the base-contact. Next, the Si$_3$N$_4$ film 5 is side-etched and after the poly-Si film 18 is deposited to the entire surface, it is etched and flattened by utilizing the photoresist film as shown in FIG. 7e. (At this time, the SiO$_2$ film 6 still remains unremoved.) Next, boron is implanted into the poly-Si film 18 for taking out the base electrode and the remaining SiO$_2$ film 6 is removed.

Here, the width d$_2$ of the contact hole 17 for taking out the base is determined by the thickness of the poly-Si film 14' on the side wall (see FIG. 7b) and the thickness d$_3$ of the SiO$_2$ film 19 on the base sidewall is determined by the difference between the thickness of the SiO$_2$ film 4 (FIG. 7c) and the thickness of the SiO$_2$ film 7 (FIG. 7d). Accordingly, the values of d$_2$ and d$_3$ can be controlled by suitably selecting the thickness for these films.

Next, the poly-Si film 18 at the portions other than the base extension region is oxidized selectively and turned to the SiO$_2$ film 19 as shown in FIG. 6, and an impurity is doped in order to form the N$^+$-type impurity doped layer 20 for taking out the collector and the P-type base region 21. After the passivation film 22 consisting of the Si$_3$N$_4$ film or PSG is deposited, the contact hole of the emitter is opened and an impurity is doped by use of the poly-Si film 23 to form the emitter region 24. The contact holes of the base and collector are then opened to form the base electrode 25, the emitter electrode 26 and the collector electrode 27. There is thus completed a transistor.

In accordance with the fabrication method of this embodiment, the depth of the step portion 40 where the single crystal Si film 18 and the base region 21 are brought into contact can be controlled by the thickness of the SiO$_2$ film 7 in FIG. 7b. The width of the contact portion in the direction of the substrate surface can be controlled by the thickness of the poly-Si film 14' that is formed on the sidewall of the three-layered film 4, 5, 6 in FIG. 7b by dry etching. Furthermore, the thickness of the insulation film for isolating the poly-Si film 18 from the single crystal Si layer 3 can be controlled by the thickness of the SiO$_2$ film 40 in FIG. 7c. Since each dimension of the contact portion can be controlled accurately as described above in accordance with this fabrication method, it is possible to prevent variations of the transistor characteristics resulting from the variation of the contact width, that has occurred in the conventional semiconductor devices, and to provide a transistor having stable characteristics.

Incidentally, though the embodiment given above illustrates an example where the invention is applied to a bipolar NPN transistor, the invention can naturally be applied to a bipolar PNP transistor. Though the embodiment deals with the application of the invention to a vertical bipolar transistor, the invention can of course be applied to a lateral bipolar transistor. Furthermore, the deep trench having the U-shaped sectional shape is formed for device isolation in the embodiment described above, device isolation can of course be made by use of the shallow trench alone.

As described above, the present invention can drastically reduce the variations of the width of the contact portion between the conductor layer for taking out the base electrode and the semiconductor layer serving as the active region and can reduce the breakdown voltage of the transistor, its parasitic capacitance, current amplification ratio and rise voltage ($V_{BE}$) to about the half of those of conventional transistors. Since the present invention uses the deep trench for device isolation, it can reduce the area of the device isolation region, so that the operation of the integrated circuit can be stabilized and higher integration density can be accomplished.

Though the invention has thus been described with reference to some preferred forms thereof, it will be obvious to those skilled in the art that various changes and modifications can be made without departing from the spirit and scope thereof.

What is claimed is:

1. A semiconductor device comprising:
   a semiconductor body of single crystal, of a first conductivity type, having a plurality of protruding portions, each of the protruding portions having an upper surface and opposed sides;
   at least one of the protruding portions having an emitter region, a base region and a collector region therein so as to form a bipolar transistor;
   insulation films on the semiconductor body between adjacent protruding portions;
   a conductive film connected electrically to said base region and extending on one of the insulation films, said conductive film having first and second film portions in contact with the base region, the contact width of each of the first and second film portions to the base region being substantially the same; and
   a respective trench extending into the semiconductor body, between each of the at least one protruding portion and an adjacent protruding portion, so as to isolate the bipolar transistor in the at least one protruding portion from an adjacent bipolar transistor, the trench being spaced from one of the opposed sides of the at least one protruding portion, in a direction parallel to the upper surface of the protruding portion.

2. A semiconductor device according to claim 1, further including a buried layer, of a second conductivity type opposite the first conductivity type, provided at least beneath the at least one protruding portion having the bipolar transistor therein, the buried layer constituting a collector buried layer of the bipolar transistor.

3. A semiconductor device according to claim 1, further comprising a shallow trench adjacent the other of the opposed sides of the at least one protruding portion.

4. A semiconductor device according to claim 1, wherein the base region extends between the opposed sides of the protruding portion, and the first and second film portions of the conductive film are respectively connected electrically to the base region at the opposed sides of the protruding portion.

5. A semiconductor device according to claim 1, wherein said conductive film is made of polycrystalline silicon into which large amounts of an impurity is doped.

6. A semiconductor device according to claim 1, wherein a side of the trench closest to said at least one protruding portion is spaced from said one of the opposed sides a distance of 0.1 to 1.0 $\mu$.

7. A semiconductor device according to claim 1, wherein a surface of the semiconductor body exposed by said trench is covered with an insulation layer.

8. A semiconductor device according to claim 7, wherein polycrystalline silicon is provided on the insulation layer within said trench so as to fill said trench.

9. A semiconductor device according to claim 1, wherein the upper surface of the at least one protruding portion, in cross section, has a step portion, wherein the base region is exposed at the upper surface of the at least one protruding portion, including at the step portion, and wherein said conductive film is electrically connected to said base through said step portion.

10. A semiconductor device according to claim 9, wherein said step portion is from 0.05 $\mu$ to 0.3 $\mu$ wide.

11. A semiconductor device according to claim 9, wherein said step portion is from 0.02 $\mu$ to 0.2 $\mu$ deep.

12. A semiconductor device according to claim 9, wherein said conductive film is made of polycrystalline silicon into which large amounts of an impurity is doped.

13. A semiconductor device according to claim 9, wherein a side of the trench closest to said at least one protruding portion is spaced from said one of the opposed sides a distance of from 0.1 $\mu$ to 1.0 $\mu$.

14. A semiconductor device according to claim 9, wherein a surface of the semiconductor body exposed by said trench is covered with an insulation layer.

15. A semiconductor device according to claim 14, wherein polycrystalline silicon is provided on the insulation layer within said trench so as to fill said trench.

16. A semiconductor device according to claim 9, wherein said conductive film is electrically connected to said base, at the upper surface of the at least one protruding portion, through the step portion.

17. A semiconductor device according to claim 9, wherein the emitter region has a larger area than that of the collector region.

18. A semiconductor device according to claim 9, wherein the conductive film extends along the one side of the at least one protruding portion and is spaced therefrom, the spacing of the conductive film from the one side being 0.03 to 0.04 $\mu$.

19. A semiconductor device comprising:
   a single crystalline semiconductor body of a first conductivity type;
   a buried layer of a second conductivity type opposite to said first conductivity type, provided in a surface region of said semiconductor body;

a plurality of protruding portions of said semiconductor body formed on predetermined portions of said buried layer, each protruding portion having an upper surface and opposed sides;

a first region, of said first conductivity type, formed in said protruding portion;

a second region, of said second conductivity type, formed in said protruding portion;

a third region interposed between said first region and said buried layer;

a recessed portion of said semiconductor body interposed between adjacent protruding portions;

a deep trench formed in said recessed portion, having a bottom that extends deeper than a lowermost surface of said buried layer;

a first insulating film continuously formed on a surface of said recessed portion and said deep trench;

a first polycrystalline silicon film formed on said first insulating film such that said deep trench is filled with said first insulating film and said first polycrystalline silicon film;

a second insulating film formed on said first polycrystalline silicon film;

a low resistance second polycrystalline silicon film, formed on said first and second insulating films, and electrically connected to said first region; and a third insulating film formed on said second polycrystalline silicon film;

wherein a sidewall of said deep trench is separated from an adjacent one of the opposed sides of an adjacent protruding portion a predetermined distance in a direction parallel to the upper surface of said protruding portion, and further wherein the second polycrystalline silicon film has first and second film portions contacting the first region, each of the first and second film portions contacting the first region with a substantially constant width.

20. A semiconductor device according to claim 19, wherein said second polycrystalline silicon film is doped with large amounts of impurities of said first conductivity type.

21. A semiconductor device according to claim 19, wherein said predetermined distance is from 0.1 $\mu$ to 1.0 $\mu$.

22. A semiconductor device according to claim 19, wherein said second polycrystalline silicon film is connected with a side surface of said first region.

23. A semiconductor device according to claim 22, wherein said first region is a base region of a bipolar transistor.

24. A semiconductor device according to claim 19, wherein said first and second conductivity types are p-type and n-type, respectively.

25. A semiconductor device according to claim 19, wherein said protruding portion has a step at the upper surface, at a peripheral edge thereof, said first region is exposed at said step, and said second polycrystalline silicon film is connected with said first region at said step.

26. A semiconductor device according to claim 25, wherein said second polycrystalline silicon film is doped with large amounts of impurities of said first conductivity type.

27. A semiconductor device according to claim 25, wherein said predetermined distance is from 0.1 $\mu$ to 1.0 $\mu$.

28. A semiconductor device according to claim 25, wherein said first insulating film extends from said upper surface of said semiconductor body, along the adjacent one of the opposed sides of the adjacent protruding portion, along surfaces of the buried layer, and along surfaces of the semiconductor body within said deep trench.

29. A semiconductor device according to claim 25, wherein said first region is a base region of a bipolar transistor.

30. A semiconductor device according to claim 25, wherein said first and second conductivity types are p-type and n-type, respectively.

* * * * *